US005455583A

United States Patent [19]
Stryjewski

[11] Patent Number: 5,455,583
[45] Date of Patent: Oct. 3, 1995

[54] COMBINED CONVENTIONAL/NEURAL NETWORK ANALOG TO DIGITAL CONVERTER

[75] Inventor: Wieslaw Stryjewski, Baton Rouge, La.

[73] Assignee: Louisiana Simchip Technologies, Inc., Baton Rouge, La.

[21] Appl. No.: 254,988

[22] Filed: Jun. 7, 1994

[51] Int. Cl.⁶ ................................................ H03M 1/12
[52] U.S. Cl. ............................................................ 341/156
[58] Field of Search ................................. 341/155, 156, 341/154, 145, 146

[56] References Cited

U.S. PATENT DOCUMENTS

| | | |
|---|---|---|
| 4,533,903 | 8/1985 | Yamada et al. . |
| 4,559,522 | 12/1985 | Sekino et al. ............................ 341/155 |
| 4,807,168 | 2/1989 | Moopenn et al. . |
| 4,983,974 | 1/1991 | Mijuskovic . |
| 4,987,417 | 1/1991 | Buckland . |
| 4,994,806 | 2/1991 | Yun-Tae . |
| 5,049,882 | 9/1991 | Gorecki et al. . |
| 5,068,662 | 11/1991 | Guddanti et al. . |
| 5,086,299 | 2/1992 | Frigerio et al. . |
| 5,179,631 | 1/1993 | Guddanti et al. . |
| 5,187,483 | 2/1993 | Yonemaru . |
| 5,194,867 | 3/1993 | Fisher . |
| 5,216,750 | 6/1993 | Smith . |
| 5,225,837 | 7/1993 | Hosotani et al. . |
| 5,258,760 | 11/1993 | Moody et al. . |
| 5,274,744 | 12/1993 | Yu et al. . |
| 5,274,745 | 12/1993 | Takashi . |
| 5,276,773 | 1/1994 | Knauer et al. . |

*Primary Examiner*—Brian K. Young
*Attorney, Agent, or Firm*—Hill, Steadman & Simpson

[57] ABSTRACT

An analog-to-digital converter employs both flash and neural converters for converting an analog input voltage. The flash converter converts the higher-order bits in a single clock cycle. Values of the lower-order bits are determined by outputs from comparators with reference voltages provided by digital-to-analog converters. The D/A converters receive inputs from the flash converter as well as from those comparators which provide output results for higher-order bits. This interconnection of D/A converters and comparators thus forms a neural network for determining the value of the lower-order bits.

15 Claims, 4 Drawing Sheets

TABLE 1

| DIGITAL OUTPUTS | | REFERENCE | | |
|---|---|---|---|---|
| MSB | LSB | | | |
| FLASH | N. NET | LSB+2 | LSB+1 | LSB |
| 0 0 0 0 0 0 | 0 0 0 | 4 | 2 | 1 |
| 1 0 1 1 0 1 | 0 0 0 | 364 | 362 | 361 |
| 1 0 1 1 0 1 | 1 1 1 | 364 | 366 | 367 |
| 1 0 1 1 0 1 | 1 1 0 | | | |

COMBINED CONVENTIONAL/NEURAL NETWORK ANALOG TO DIGITAL CONVERTER

BACKGROUND OF THE INVENTION

1. Field of the Invention

This invention relates generally to the field of analog-to-digital converters and more particularly this invention relates to analog-to-digital converters which employ neural network and conventional analog-to-digital converter circuitry for converting an analog voltage into a digital signal.

1. Description of the Prior Art

A wide variety of electronic circuit designs for analog-to-digital converters (referred to hereinafter as A/D converters) are known in the art. One such design employs successive approximation to accomplish conversion. In this design a binary number generator is coupled to a digital-to-analog converter (hereinafter D/A converter). The output of the D/A converter is coupled to a first input of a comparator and the input analog voltage to be converted is coupled to a second input of the comparator. The output from the binary number generator changes in value until the output of the D/A converter approximately equals the input voltage. The binary number which the number generator is producing at the time the threshold is reached is considered the digital equivalent of the analog voltage. Although this circuit is not as complex as some other A/D converter designs, it must perform a series of approximations before an accurate result is achieved (n steps for an n-bit converter). Accordingly, this type of A/D converter is undesirably slow.

Another A/D converter which performs conversions faster than the successive approximation design is a parallel flash A/D converter. In a parallel flash A/D converter, a binary digital output representative of the analog input voltage is produced in a single clock cycle. Conventional flash A/D converters employ resistor ladder networks in which a series of resistors each having similar values are connected between a reference voltage and ground to form nodes between the resistors that provide reference voltages for a number of voltage comparators. The reference voltages are applied to a first input of each comparator and the analog input voltage to be converted is connected to a second input of the comparators. The output from the comparators depends on whether or not the input voltage exceeds the corresponding reference voltage. These outputs are encoded to produce a binary number having a value corresponding to the value of the analog input voltage. Although flash A/D converters are much faster than successive approximation designs, they require complex circuitry and have increased power requirements.

It is understood that in general there is a tradeoff between circuit size and speed in A/D converters. Conventional successive approximation A/D converters are smaller in size than flash converters, however, as noted, they require a relatively large number of clock cycles to provide an accurate digital representation of the input analog voltage. In contrast, the flash A/D converter produces an output in only a single clock cycle, however, the circuitry for this design is much more complex. This design requires a resistor ladder network having $2^n + 1$ resistors for $2^n$ stages, each of which includes a comparator in addition to the decoding network. Thus, this circuit requires a relatively large array of solid state devices for implementation.

Another approach to the design of analog to digital converters is found in U.S. Pat. No. 4,994,806 invented by Yun-Tae. This design improves conversion by combining both successive approximation and flash conversion for separate bits in the conversion process. This design provides conversion results more quickly than full successive approximation designs, however, it also requires a fairly large amount of circuitry and is not nearly as fast as the flash A/D converter.

U.S. Pat. No. 4,987,417 invented by Buckland discloses a final design which is an adaptive reference A/D converter. In this design, the outputs from higher-order comparators feed forward through a resistor network to the reference inputs of lower-order comparators. This forms a neural network for performing the conversion wherein the comparison voltage for a given comparator depends on the output of higher-order comparators. The conversion performed by this design is not complete, however, until each comparator produces a stable output. Additionally, the A/D converter neural network design of the Buckland Patent is of limited utility because the resistor network is difficult to implement in converter designs having higher resolution.

My co-pending United States patent application titled, Latched Neural Network A/D Converter, Ser. No. 08/255,085, filed Jun. 7, 1994 which is incorporated herein by reference, discloses improved neural network circuitry for use in A/D converters. Additionally, this application discloses circuitry which is capable of completing the conversion process in a limited number of neural network conversion steps.

While these designs have improved the speed of A/D converters and/or decreased the circuitry necessary for implementation, there remains a need in the field for fast A/D converters with high resolution and limited circuit complexity. It is therefore an object of the present invention to provide a high resolution, high speed A/D converter which performs the conversion with a limited number of circuit elements.

SUMMARY OF THE PRESENT INVENTION

The Combined Conventional/Neural Network A/D Converter of the present invention performs accurate, high speed conversions while minimizing the circuitry necessary for implementation. This design further increases the converter speed of the converter disclosed in my co-pending application. It employs the improved neural network circuitry disclosed in my co-pending application, Ser. No. 08/255,085 along with conventional A/D circuitry to perform the conversion. In this design, the analog input voltage is fed into a sample and hold unit which provides a fixed signal level output. This output is applied to conventional A/D converter circuitry which performs the conversion of the higher-order bits. Additionally, this output is applied to a first input of the comparators which determine the values for the lower-order bits. In a preferred embodiment, the conventional circuitry is a "flash" design which is able to convert the higher-order bits in essentially a single clock cycle to realize higher conversion speeds for the overall circuit. The flash converter output value is the digital output for the higher-order bits of the combined conventional/neural converter. This output is also applied to the D/A converters that provide the voltage reference levels for the comparators which determine the lower-order bits of the combined conventional/neural A/D converter.

The outputs from the comparators are stored in a register where they are also provided as outputs for the combined circuit. Outputs from all but the lowest order comparator feed forward to the D/A converters which set the reference voltages of the remaining lower-order comparators. The D/A converters thus provide adaptive references for the comparators and form a neural network which determines the values of the lower-order bits based on the outputs from higher-order bits. The output from the LSB+N comparator feeds forward to the LSB+N input of each of the lower-order D/A converters. The input bit of each D/A converter which corresponds to the conventional/neural converter output for which the D/A provides a reference voltage is set to logical "1" while the remaining lower-order inputs of this D/A are fixed at logical "0" (i.e. the LSB input bit for the D/A converter which provides the reference voltage for the LSB comparator is set to logical "1" and none of the input bits on this D/A converter are set to logical "0"; the LSB +1 input bit for the D/A converter which sets the reference voltage for the LSB +1 comparator is set to logical "1" while its LSB input is set to logical "0", etc.).

This converter design provides fast, accurate results with less circuitry than the prior art designs. It is capable of providing valid results for the most significant bits in a single clock cycle when a flash converter is used for the conventional circuitry. Conversion results for full resolution are available at least within n clock cycles where n is the number of lower-order bits which are converted by the neural network circuitry. Additionally, this design is more flexible than other prior art designs in that it allows selection of a particular number of steps for conversion of the lower-order bits or alternatively, the circuit is capable of internally determining when conversion of the lower-order bits is complete.

DETAILED DESCRIPTION OF THE PREFERRED EMBODIMENT

Figure 1:
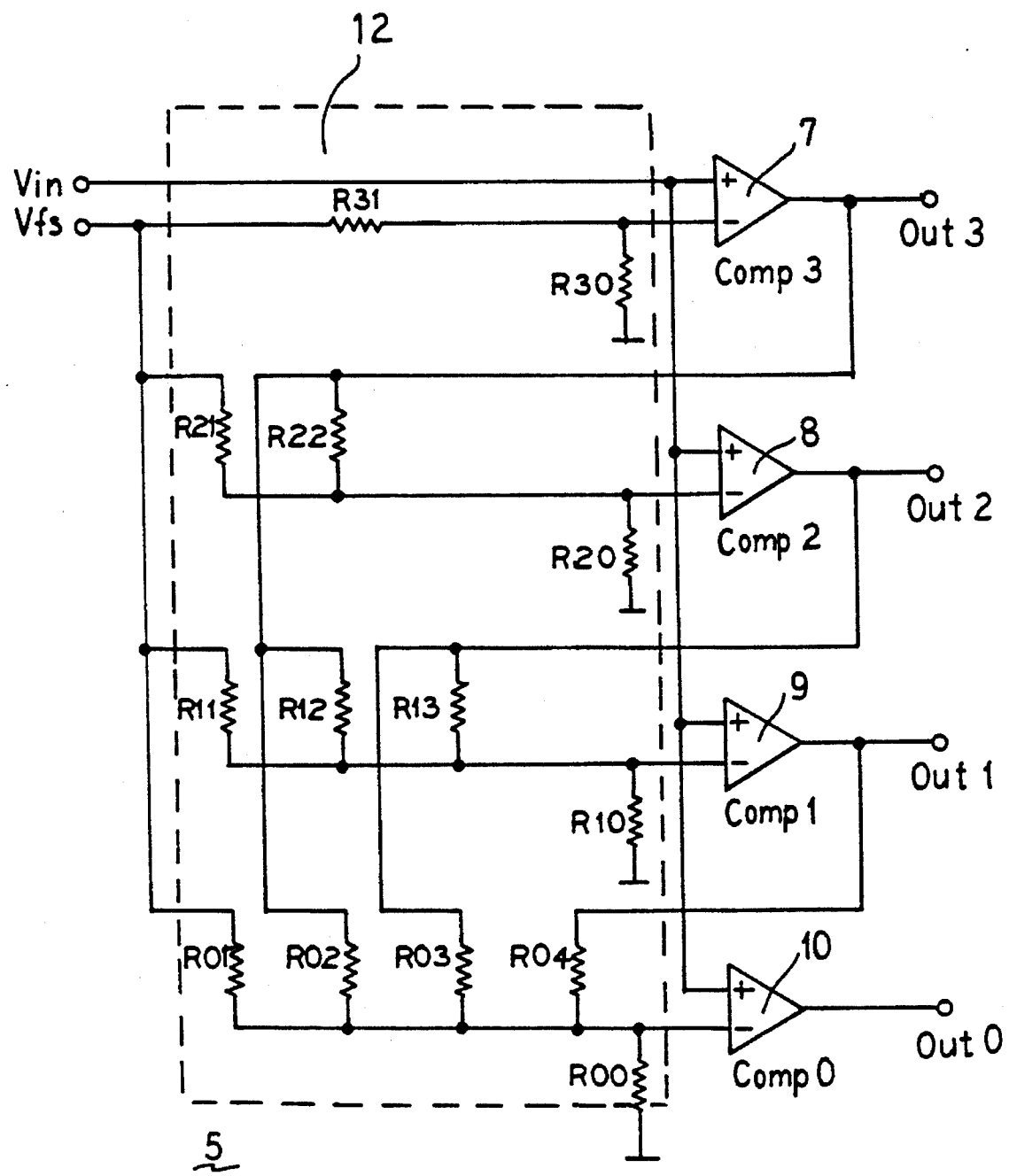
FIG. 1 illustrates a prior art A/D converter which employs a neural network for conversion.

FIG. 1 illustrates a prior art A/D converter shown generally at 5. This design employs a neural network for accomplishing the conversion and is described in greater detail in U.S. Pat. No. 4,987,417 invented by Buckland. In this design, only n comparators are required to perform the conversion process where N is the number of bits of desired resolution. This is in contrast to $2^n$ comparators required for flash A/D converters.

As shown, an input voltage $V_{in}$ is input to a first input of each of the comparators 7–10. The output of all but the lowest order comparator is fed forward to each of the remaining lower-order comparators through a resistor network 12. Reference voltage $V_{ref}$ is also supplied and connected through the resistor network to a second input of each of the comparators 7–10. Each of the comparators other than the highest order comparator has a reference voltage which is a combination of $V_{ref}$ and the output of each of the higher-order comparators fed through the resistor network. This design decreases the circuit complexity in that for N bits of resolution only N comparators are needed rather than $2^n$ which are needed for a flash comparator. However, this design sacrifices speed for circuit complexity in that conversion is not complete until each of the comparators provides a stable output. Additionally, as noted above, this neural network design is of limited utility because the resistor network is difficult to implement when used with converters having higher resolution.

Figures 2, 4:
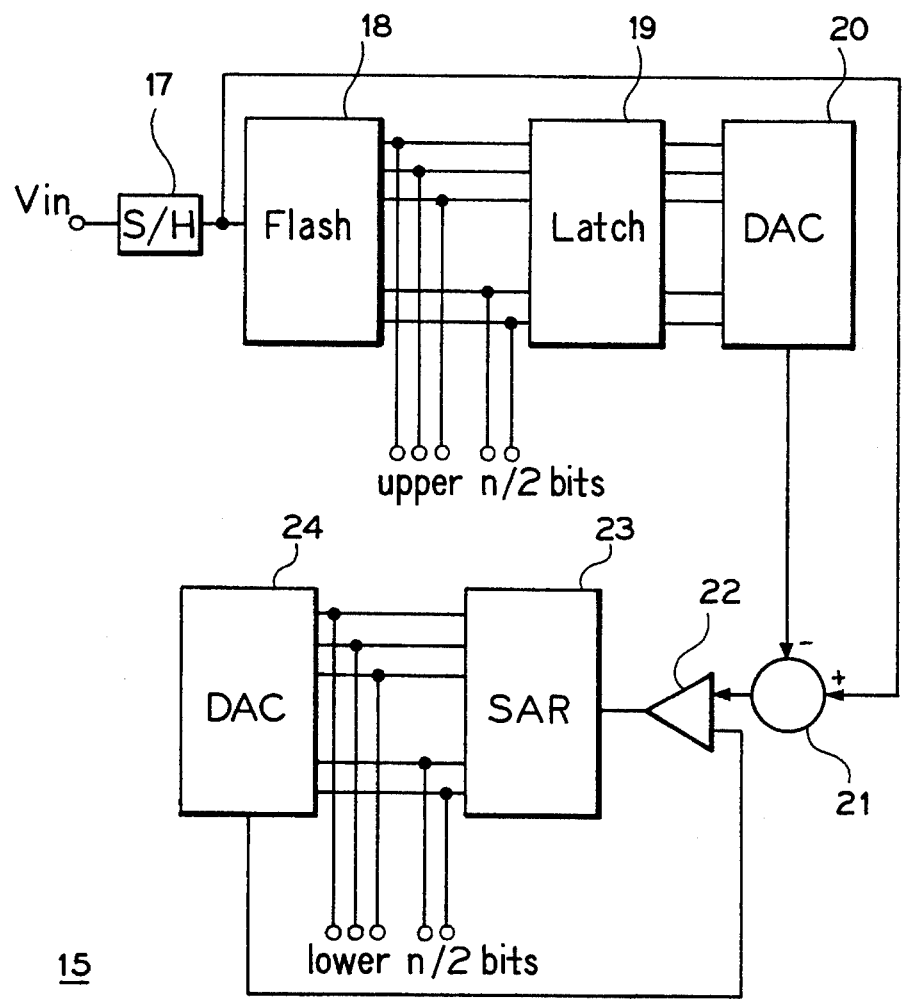
FIG. 2 illustrates a prior art A/D converter which employs both flash and successive approximation circuitry.
FIG. 4 illustrates a table describing steps in the operation of the A/D converter described in FIG. 3.

FIG. 2 illustrates another prior art design shown generally at 15. In this design a sample and hold unit 17 provides a stable output source for converting the analog input voltage. During the first clock cycle the flash converter 18 provides the digital value of the n/2 upper bits of the converter where n is the number of bits of resolution for the converter. Latch 19 takes the output from flash converter 18 and applies the converted value to the input lines of D/A converter 20. The output from D/A converter 20 is subtracted from the input analog voltage Vin in the subtractor unit 21. The output from the subtractor 21 is applied to a first input of comparator 22. Successive approximation register 23 operates in conjunction with D/A converter 24 to provide an output voltage which approaches the value of the voltage output from the subtractor 21. When the difference between the output from the D/A converter and the voltage from the subtractor reaches a threshold, the original input to the D/A converter is considered to be the value of the lower-order bits.

Figure 3:
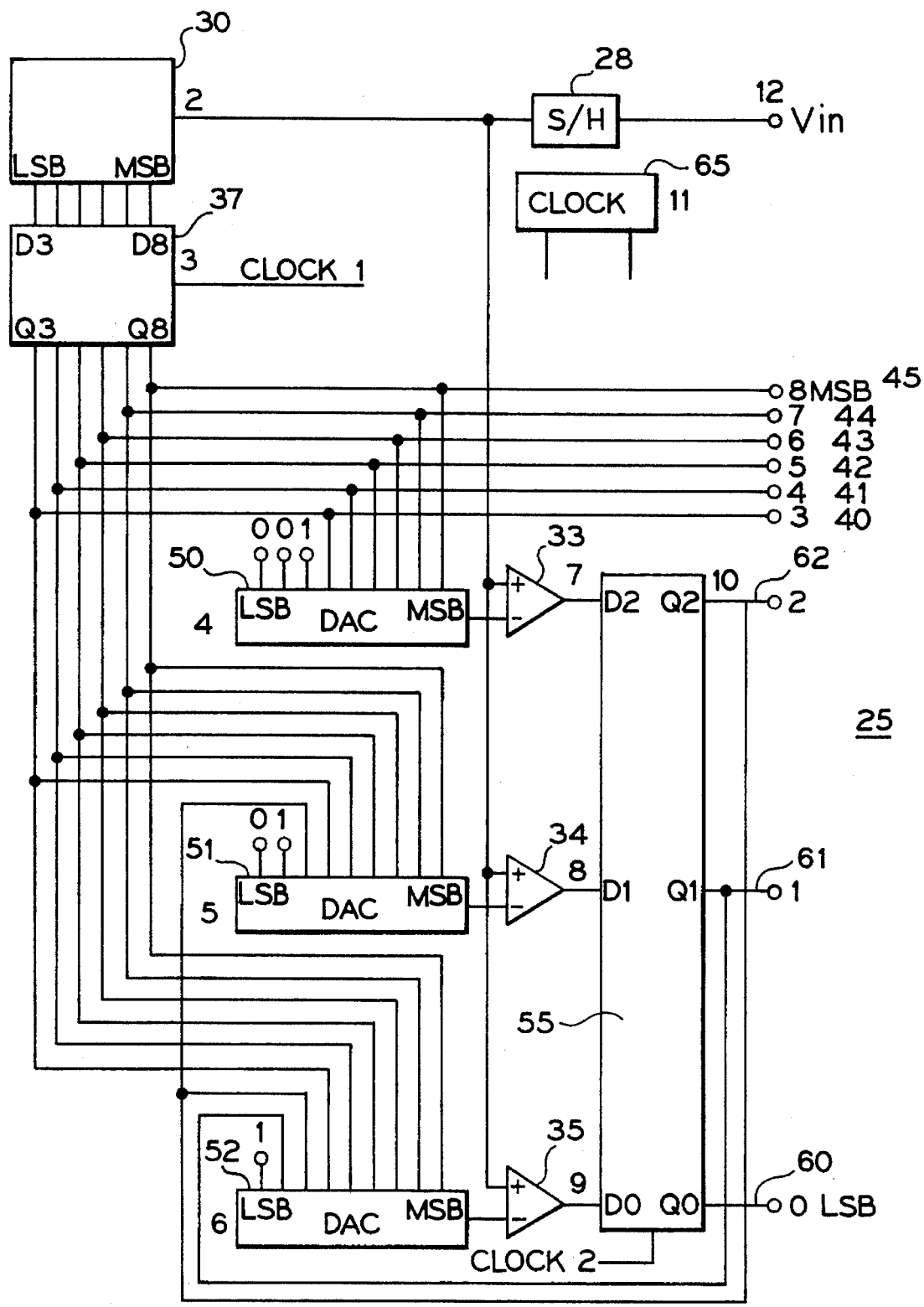
FIG. 3 illustrates an embodiment of the A/D converter of the present invention which provides 9-bits of resolution where the first 6 bits are converted with a flash converter.

With reference to FIG. 3, an embodiment of the A/D converter of the present invention is disclosed. In this embodiment the conventional/neural converter 25 is shown as a 9-bit converter which converts the six most-significant bits via a flash converter and the three lowest-order bits via a neural network. The flash converter provides an output which is the higher-order portion of the digital signal while the neural network produces an output which is the lower-order portion of the digital signal. Although in the preferred embodiment the circuitry for converting the higher-order bits is a flash converter, it is recognized that other conventional A/D converters may be used for conversion of the higher-order bits.

Higher speed designs are preferred for the higher-order bits in order to realize the highest possible output speed for the overall converter, however, any conventional A/D converter design will provide satisfactory results. Some exemplary designs include various successive approximation A/d converter circuits, logarithmic, as well as tracking type circuit diagrams and sources for these and other converter designs can be found in the Encyclopedia of Electronic Circuits, Vol. 1, by Rudolf F. Graf, 1985 pages 43–50. Other exemplary conventional A/D converter circuits which may be used with the present invention include designs such as the switched capacitor, tracking, flash, or half flash A/D converter designs. Circuit diagrams and sources for these and other converter designs can be found in the Encyclopedia of Electronic Circuits, Vol. 3, by Rudolf F. Graf, 1985 pages 22–26. Those skilled in the art will appreciate that designs such as the delta-sigma, charge distribution, dual slope integrating, subranging or foldback converters may also be used. It is only necessary that the neural network receive a digital signal representative of the higher-order bits of the analog input voltage.

In the preferred embodiment illustrated in FIG. 3, an analog input voltage, $V_{in}$ is provided at the input of sample and hold unit 28. The output from sample and hold 28 is directly connected to a 6-bit flash A/D converter 30 as well as to a first input of each of three voltage comparators 33–35. The 6-bit flash A/D converter 30 provides the 6 highest-order bits of conversion in a single clock pulse. The 6-bit digital output from A/D converter 30 feeds directly into latch 37 which holds the converted value on its output lines. These outputs provide the 6 most-significant bits of the flash/neural converter 25 on the converter output lines 40–45. The outputs from latch 37 are also directly connected to the 6 most-significant bits of 9-bit D/A converters 50–52. Analog voltage outputs from each of the D/A converters 50–52 are connected to corresponding second inputs of comparators 33–35 and the outputs from comparators 33–35 feed directly into a 3-bit latch 55. The outputs 60–62 of latch 55 provide the three lowest-order bits of the flash/neural converter 25.

The three least-significant bits of D/A converter 50 are set to a fixed value. Its least significant bit (LSB) and LSB +1 are set to logical 0 while the LSB +2 input is set to logical 1. Only the two least significant bits of D/A converter 51 are set to a fixed value. The LSB is set to logical 0 and LSB +1 is set to logical 1. Its LSB +2 input is connected to the output 62 from 3-bit latch 55. The LSB D/A converter 52 only has its LSB input fixed at logical 1. Its LSB +1 input is connected to output 61 from latch 55 while its LSB +2 input is connected to output 62 from latch 55. A clock 65 provides the necessary timing signals for the flash A/D converters, the D/A converters, the various latches and sample and hold unit.

The interconnection of the D/A converters and comparators forms a neural network in which the voltage reference levels for the comparators vary depending upon the results from higher-order comparators in the neural network and the output from the flash converter. While the exemplary embodiment of FIG. 3 describes an A/D converter in which only its three-least significant bits are converted via a neural network and its 6 most-significant bits are converted with a flash converter, it is understood that numerous other ratios between conventional and neural converters are contemplated with similar designs. The flash portion of the converter may be performed via any flash A/D converter design. The neural conversion circuitry may also be implemented with various designs. Some of these designs are disclosed in my co-pending application, Ser. No. 08/255,085, titled Latched Neural Network A/D converter. In the design of the preferred embodiment, longer chains of interconnected D/A converters and comparators can be implemented simply through the addition of additional stages. In similar designs, the output from the LSB+N comparator feeds forward to the LSB+N input of each of the lower-order D/A converters. The input bit of each D/A converter which corresponds to the flash/neural converter output for which the D/A provides a reference voltage is set to logical "1" while the remaining lower-order inputs of this D/A are fixed at logical "0" (i.e. the LSB input bit for the D/A converter which provides the reference voltage for the LSB comparator is set to logical "1" and none of the input bits on this D/A converter are set to logical "0"; the LSB +1 input bit for the D/A converter which sets the reference voltage for the LSB +1 comparator is set to logical "1" while its LSB input is set to logical "0", etc.).

Operation of the 9-bit A/D converter of the preferred embodiment will be described by way of the following example. For this example, it is assumed that the analog input signal $V_i$ in ranges from 0 to 511 (input signal units). The 6-bit flash A/D converter converts signals in this range with 8 units of resolution (i.e. "000000" is the output for an input signal <8; "000001" is the output for 8≦ input signal <16, etc.).

It is also assumed that the outputs from D/A converters can vary from 0 to 511 units. Table 1 illustrated in FIG. 4 describes how the conversion is made for an input signal of 366.4. The first row indicates the output values for the flash A/D converter and the neural network prior to receipt of the input signal (all outputs are assumed initially to be set to logical 0). Upon receipt of the first clock pulse, the sample and hold unit 28 sets its output to a value of 366.4 units. The output of a sample and hold unit 28 is held at this value until conversion is complete and applied to the positive inputs of comparators 33–35. The flash A/D converter converts the first 6-bits and latch 37 stores the converted value as "101101." The 6 most significant bits of the flash/neural converter are now available on output lines 40–45 and provide an accurate representation of these bits. The three lower-order bits of the converter remain at logical 0 and are not valid at this time. The outputs from each of the comparators 33–35 are all set to logical 0 because the analog input voltage is greater than the outputs from each of the 9-bit D/A converters. These outputs are initially 4, 2 and 1 respectively. The columns labeled LSB +2, LSB +1, and LSB each indicate the corresponding D/A converter output values.

When D/A converters 50–52 receive the output from latch 37, the comparison values change to 364 (256+64+32+8= 360+4=364), 362 (360 +2), and 361 (360 +1) respectively. The value of "111" is then stored in the output of register 55. During the next clock cycle, new outputs feed forward and change the output from D/A converters 51, 52. New voltage references from the D/A converters become 364, 366, and 367. The output of register 55 is now set to "110." This output on lines 60–62 combined with the 6 most significant bits on lines 40–45 now provide valid conversion data.

Figure 5A:
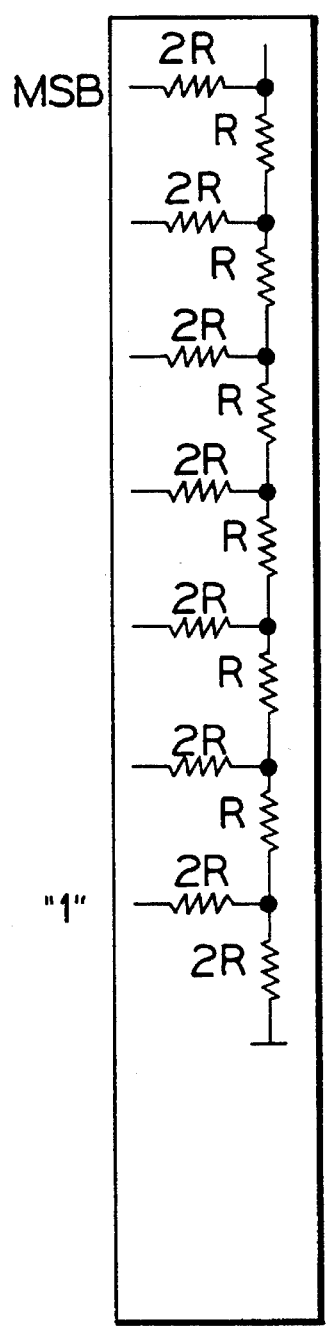
FIGS. 5a–5c illustrates the R-2R resistor networks which are employed in the D/A converters shown in FIG. 3.
Figure 5B:
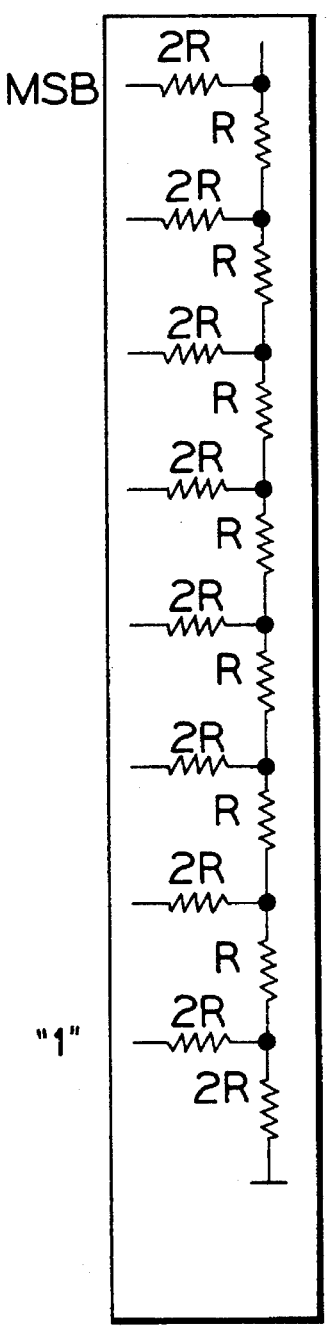
Figure 5C:
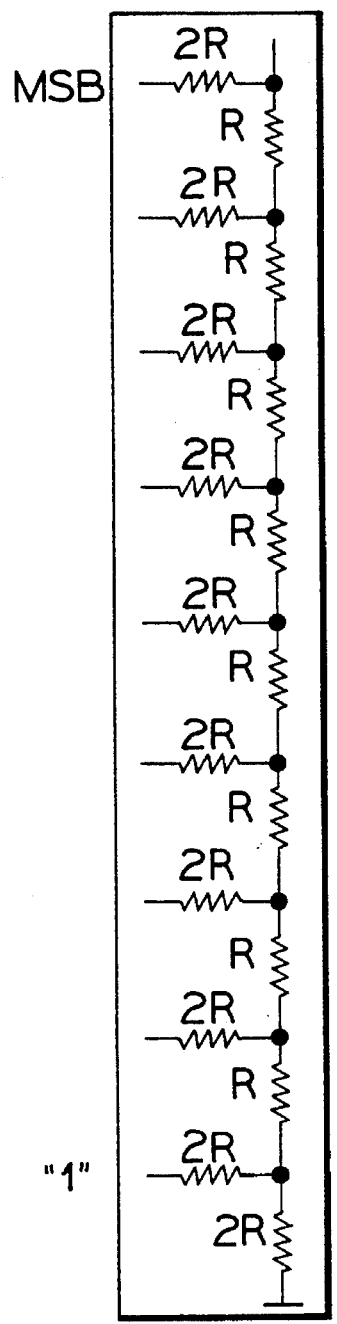

FIGS. 5a–5c illustrates the R-2R resistor ladders employed in the D/A converters which are used in the neural network. It is not necessary for the D/A converters to each have the same number of digital inputs as only the D/A converter which provides the reference for the LSB of the converter is required to have N inputs where N is the number of bits of resolution for the A/D converter (9 in the example of FIG. 3). Each of the D/A converters which provide the reference for comparators above the LSB have at least one input set to logical 0. Therefore D/A converters with fewer inputs may be used. The LSB +1 D/A converter requires n–1 inputs, the LSB +2 position requires n–2 inputs, etc. It is recognized that a shorter resistor ladder consumes less power, can be implemented with fewer circuit elements and is also faster. It is also recognized that the particular design of the D/A converters is not relevant and that the combined flash/neural network A/D converter of the present invention is not limited to designs which employ D/A converters which use an R/2R resistor network. The D/A converters need only supply the desired output voltage for a given digital input. Any other conventional D/A converter design may also be selected. Alternatively, resistor ladder networks may also be used to supply the appropriate voltages.

The neural network which performs the conversion of the lower-order bits may be operated so that there is a conversion step performed for each bit which is converted by the neural network in order to ensure that accurate conversion results are achieved. It has been recognized that it is unnecessary to perform a step for each bit which is converted by the neural network and that the results are often available much sooner. Details relating to operation of A/D converter networks employing a limited number of steps are disclosed in my co-pending application, Latched Neural Network A/D Converter, Ser. No. 08/255,085, filed Jun. 7, 1994. There are essentially two alternatives for performing the A/D conversion using a limited number of conversion steps in the neural network. Either the current outputs from the neural network output register are compared with previous results to ensure that accurate results are achieved or the output may be considered as "valid" conversion data after a predetermined number of neural network conversion steps have been performed for a given sample.

While conversion by the neural network portion of the converter will always be complete in n clock cycles where n is the number of bits converted in the neural network, it has been found that valid outputs are often available much earlier. Conversion speeds can be dramatically increased without a corresponding decrease in conversion accuracy by making use of this discovery. It has been found that the number of conversion steps necessary to perform conversion of a ramp of voltages is a Gaussian-like distribution with n/2 steps being the most frequent number of steps required to accurately perform the conversion. (n being the number of bits converted via the neural network)

It is recognized therefore that performing n conversion steps with the n-bit converter is usually unnecessary. Accurate conversions can generally be completed in a few steps. It is recognized that an average of only n/2 steps is required to perform accurate conversions. The recognition that fewer than n steps are usually required to convert a given voltage for an n-bit converter may be used to further increase conversion speeds. As noted, one technique for decreasing the number of steps is to compare the current outputs from registers with the outputs of the previous step. If the outputs remain unchanged, the conversion data is valid and the sample and hold unit may be cycled for converting another voltage value. When identical results appear on the output from the register, it is known that the neural network is stable, the results are valid, and a new voltage may be converted. This is due to the fact that if the outputs remain unchanged, the reference levels of all of the comparators will also remain unchanged. Any technique for comparing the outputs may be used including the use of voltage comparators.

Rather than comparing current results with previous results for determining when conversion is complete, the circuits of the present invention may be used to provide conversion results in a predetermined number of steps after conversion is initiated. Although it is likely that errors will occur in the lower-order output bits occasionally, it is believed that these occurrences are statistically insignificant and are acceptable for many applications.

In one final application, the two techniques could be combined whereby a microprocessor controls the conversion process to further increase the speed of conversion. It is recognized that the stability of the outputs from the register increase with an increasing number of conversion steps. Furthermore, the likelihood that a given register output is stable, decreases with decreasing significance of the particular output bit. The processor could be programmed to consider the output valid when either a given number of conversion steps have been performed or when only one or two lower-order bits have the potential for changing. These are but a few examples, a wide variety of alternatives exist for control of the A/D converters of the present invention via microprocessors.

Furthermore, computer simulations indicate that even further savings in the number of steps will be realized if the results from previous conversions performed by the neural network portion of the converter ate used as a starting point for subsequent conversions. (the higher-order bits would always be received from the conventional portion of the A/D converter and as this is generally a flash A/D converter, these bits would always be used for conversion of the current sample by the neural network) The improvement is due to the fact that the converter essentially starts with the preceding conversion result for converting the next value. Simulated results indicate that in many instances only 2 steps are required to perform complete conversion.

The present invention is subject to many variations, modifications and changes in detail, it is intended that all matter described throughout the specification and shown in the accompanying drawings be considered illustrative only. Accordingly, it is intended that the invention be limited only by the spirit and scope of the appended claims.

I claim:

1. A circuit for converting an analog voltage into a digital signal, comprising:

a first A/D converter for converting the analog voltage into a higher-order portion of the digital signal;

a neural network for converting the analog voltage into a lower-order portion of the digital signal having a plurality of ordered bits, said neural network including, for each bit of said lower-order portion of said digital signal, a voltage source and a comparator, at least one of said comparators having a voltage reference level provided by the voltage source having an output voltage determined by an output of a comparator associated with a higher-order bit of said lower-order portion of the digital signal.

2. The circuit of claim 1 wherein each voltage source further comprises an R-2R resistor network for generating an output voltage.

3. The circuit of claim 1 wherein each voltage source further comprises a D/A converter for generating an output voltage.

4. The circuit of claim 3 wherein a resistor network of at least one D/A converter comprises fewer individual resistors than other D/A converter resistor networks.

5. The circuit of claim 1, wherein the first converter generates a larger number of output bits for the digital signal than the neural network.

6. The circuit of claim 1, wherein the first converter generates a smaller number of output bits for the digital signal than the neural network.

7. The circuit of claim 1, wherein the neural network does not provide a least significant output bit of the digital signal.

8. A method of converting an analog voltage into a digital signal comprising the steps of:

converting the analog voltage into a higher-order portion of the digital signal with a first A/D converter;

converting the analog voltage into a lower-order portion of the digital signal, having a plurality of ordered bits with a neural network, the neural network including for each bit of said lower-order portion of said digital signal, a voltage source and a comparator at least one of said comparators receiving an output voltage from at least one voltage source having an output voltage which depends on an output of a comparator associated with a higher-order bit of said lower portion of said digital signal.

9. The method of claim 8, wherein the first converter generates a larger number of output bits for the digital signal than the neural network.

10. The method of claim 8, wherein the first converter generates a smaller number of output bits for the digital signal than the neural network.

11. The method of claim 8, further comprising the step of selecting the number of conversion steps to be performed by the neural network.

12. A circuit for converting an analog voltage into a digital signal comprising:

a first A/D converter for converting the analog voltage into a higher-order portion of the digital signal;

a neural network for converting the analog voltage into a lower-order portion of the digital signal having a plurality of ordered bits, the neural network including at least one voltage source and a plurality of comparators, at least one of the plurality of comparators defining one of the plurality of ordered bits and exclusively feeding forward its output at least to a voltage source for an adjacent lower-order comparator to help determine a voltage reference level for the adjacent lower-order comparator.

13. The circuit for converting an analog-voltage into a digital signal of claim 12, wherein each comparator of the plurality of comparators for the neural network, other than a lowest-order comparator, have an output which defines one of the plurality of ordered bits and which exclusively feeds-forward to voltage reference level sources of each remaining lower-order comparator to help determine the reference levels of the lower-order comparators.

14. The circuit for converting an analog-voltage into a digital signal of claim 12, wherein at least two comparators of the plurality of comparators of the neural network, other than a lowest-order comparator, have an output which defines one of the plurality of ordered bits and which exclusively feeds-forward to the voltage reference level sources of remaining lower-order comparators in the neural network to help determine the reference levels of the remaining lower-order comparators.

15. A method of converting an analog voltage into a digital signal comprising the steps of:

converting the analog voltage into a higher-order portion of the digital signal with a first A/D converter;

converting the analog voltage into a lower-order portion of the digital signal having a plurality of ordered bits with a neural network, the neural network including at least one voltage source and a plurality of comparators, at least one of the comparators defining one of the plurality of ordered bits and exclusively feeding forward its output to the voltage source for an adjacent lower-order comparator to help determine a voltage reference level for the adjacent lower-order comparator.

* * * * *